United States Patent
Miller et al.

(10) Patent No.: US 9,720,147 B2
(45) Date of Patent: Aug. 1, 2017

(54) REFLECTIVE DIFFRACTION GRATING AND FABRICATION METHOD

(71) Applicant: Lumentum Operations LLC, Milpitas, CA (US)

(72) Inventors: John Michael Miller, Gatineau (CA); Hery Djie, San Jose, CA (US); Patrick Lu, Mountain View, CA (US); Xiaowei Guo, Pleasanton, CA (US); Qinghong Du, Fremont, CA (US); Eddie Chiu, Pleasanton, CA (US); Chester Murley, Manotick (CA)

(73) Assignee: Lumentum Operations LLC, Milpitas, CA (US)

( * ) Notice: Subject to any disclaimer, the term of this patent is extended or adjusted under 35 U.S.C. 154(b) by 126 days.

(21) Appl. No.: 14/229,399

(22) Filed: Mar. 28, 2014

(65) Prior Publication Data

US 2015/0276998 A1 Oct. 1, 2015

(51) Int. Cl.
*G02B 5/18* (2006.01)
*G02B 1/10* (2015.01)
*B29D 11/00* (2006.01)
*G03F 7/00* (2006.01)

(52) U.S. Cl.
CPC ...... *G02B 5/1861* (2013.01); *B29D 11/00769* (2013.01); *G02B 5/1857* (2013.01); *G03F 7/001* (2013.01)

(58) Field of Classification Search
CPC .. G02B 5/1861; G02B 5/1857; G02B 5/1838; G02B 5/1814; G02B 5/1809; G02B 5/18; G02B 1/10; G02B 5/1847; B29D 11/00769; G03F 7/001; C03C 17/36; C03C 17/3602

USPC .......... 359/361, 566–569, 572, 576; 430/1–2
See application file for complete search history.

(56) References Cited

U.S. PATENT DOCUMENTS

| | | | |
|---|---|---|---|
| 5,907,436 A | 5/1999 | Perry et al. | |
| 6,680,799 B1 | 1/2004 | Parriaux et al. | |
| 7,142,363 B2 | 11/2006 | Sato et al. | |
| 7,554,734 B1 | 6/2009 | Holm et al. | |
| 7,688,512 B2 | 3/2010 | Kittaka et al. | |
| 8,040,607 B2 | 10/2011 | Miller | |
| 8,238,025 B2 | 8/2012 | Parriaux | |
| 8,270,079 B1 * | 9/2012 | Mossberg ............ | G02B 5/1814 359/567 |
| 8,279,737 B2 | 10/2012 | Miyasaka et al. | |
| 2002/0018869 A1 * | 2/2002 | Abiko .................... | G11B 7/007 428/64.4 |

(Continued)

OTHER PUBLICATIONS

Martinez et al., "Titanium diffusion in gold thin films", Thin Solid Films, 2010, vol. 518, pp. 2585-2591.

(Continued)

*Primary Examiner* — Thomas K Pham
*Assistant Examiner* — Marin Pichler
(74) *Attorney, Agent, or Firm* — Harrity & Harrity, LLP

(57) ABSTRACT

A reflective diffraction grating and a fabrication method are provided. The reflective diffraction grating includes a substrate, a UV-absorbing layer, a grating layer having a binary surface-relief pattern formed therein, and a conforming reflective layer. Advantageously, the UV-absorbing layer absorbs light at a UV recording wavelength to minimize reflection thereof by the substrate during holographic patterning at the UV recording wavelength.

20 Claims, 7 Drawing Sheets

(56) References Cited

U.S. PATENT DOCUMENTS

2007/0183047 A1* 8/2007 Phillips .................. B32B 27/36
                                                          359/572
2008/0062523 A1   3/2008 Rancourt
2010/0330303 A1* 12/2010 Ohoshi ................. G11B 7/263
                                                          427/595

OTHER PUBLICATIONS

Shiozaki, et al., "Novel Design of Polarization Independent Multi-layer Diffraction Grating with High Angular Dispersion", SEI Technical Review, 2005, No. 59, pp. 27-31.
Britten et. al., "High-Efficiency, Dielectric Multilayer Gratings Optimized for Manufacturability and Laser Damage Threshold", preprint for SPIE Proceedings, 1995, vol. 2714.

\* cited by examiner

| Profile parameters for 1150 lines/mm reflective diffraction grating in air ||||
|---|---|---|---|---|
| Parameter | Target value | Low value | High value | Tolerance (±) |
| AGW (μm) | 0.495 | 0.346 | 0.646 | 0.150 |
| $d$ (μm) | 0.252 | 0.203 | 0.303 | 0.050 |
| $a$ (°) | 1.0 | −4.1 | 5.9 | 5.0 |
| AOI (°) | 66.1 | 65.1 | 67.1 | 1.0 |

FIG. 4A

| Profile parameters for 1624 lines/mm reflective diffraction grating in grism ||||
|---|---|---|---|---|
| Parameter | Target value | Low value | High value | Tolerance (±) |
| AGW (μm) | 0.320 | 0.280 | 0.360 | 0.040 |
| $d$ (μm) | 0.190 | 0.165 | 0.215 | 0.025 |
| $a$ (°) | 0.0 | −2.5 | 2.5 | 2.5 |
| AOI (°) | 58.1 | 57.1 | 59.1 | 1.0 |

FIG. 4B

| Profile parameters for 1670 lines/mm reflective diffraction grating in grism ||||
|---|---|---|---|---|
| Parameter | Target value | Low value | High value | Tolerance (±) |
| AGW (μm) | 0.310 | 0.270 | 0.350 | 0.040 |
| $d$ (μm) | 0.190 | 0.165 | 0.215 | 0.025 |
| $a$ (°) | 0.0 | −2.5 | 2.5 | 2.5 |
| AOI (°) | 53.5 | 52.5 | 54.5 | 1.0 |

FIG. 4C

REFLECTIVE DIFFRACTION GRATING AND FABRICATION METHOD

TECHNICAL FIELD OF THE INVENTION

The present invention relates to a reflective diffraction grating and, more particularly, to a binary surface-relief reflective diffraction grating. The present invention also relates to a method of fabricating such a reflective diffraction grating.

BACKGROUND OF THE INVENTION

Reflective diffraction gratings are used to provide wavelength dispersion in wavelength-selective optical devices, such as wavelength selective switches (WSSs). Conventional reflective diffraction gratings include metal-coated diffraction gratings and multilayer dielectric gratings.

Although many fabrication methods exist, metal-coated diffraction gratings are most often produced by replication. In this fabrication method, a ruled or holographically patterned master is embossed or copied into a resin grating layer, e.g., formed of epoxy, to form a surface-relief pattern therein. The surface-relief pattern is then coated with a conforming reflective metal layer to form the metal-coated diffraction grating. Unfortunately, the resin grating layer is not stable at high temperatures, e.g., greater than 130° C. for an epoxy grating layer. Therefore, care must be taken to use low temperatures during the manufacture of devices incorporating such metal-coated diffraction gratings in order to prevent temperature-induced changes in the surface-relief pattern. Furthermore, any demolding materials or release layers used during the fabrication of such metal-coated diffraction gratings must be entirely removed from the resin grating layer prior to coating with the reflective metal layer in order to avoid reliability issues.

On the other hand, multilayer dielectric gratings are, typically, produced by direct etching. In this method, a surface-relief pattern is etched through an etch mask into a reflective thin-film stack, which includes a large number of thin-film dielectric layers. For example, multilayer dielectric gratings including a reflective thin-film stack formed of alternating silica ($SiO_2$) and tantala ($Ta_2O_5$) layers are disclosed in U.S. Pat. No. 8,238,025 to Parriaux, issued on Aug. 7, 2012, in U.S. Pat. No. 6,680,799 to Parriaux et al., issued on Jan. 20, 2004, in U.S. Pat. No. 5,907,436 to Perry et al., issued on May 25, 1999, and in U.S. Patent Application Publication No. 2008/0062523 to Rancourt, published on Mar. 13, 2008, which are incorporated herein by reference. Unfortunately, such multilayer dielectric gratings are, generally, difficult and expensive to manufacture because of the large number of process steps involved. Furthermore, when the etch mask is patterned by holography at a recording wavelength, reflection of light at the recording wavelength by the reflective thin-film stack and/or a substrate on which the thin-film stack is disposed may lead to undesired interference patterns detrimental to the resulting surface-relief pattern.

SUMMARY OF THE INVENTION

Accordingly, the present invention relates to a reflective diffraction grating comprising: a substrate; an ultraviolet (UV)-absorbing layer disposed over the substrate for absorbing light at a UV recording wavelength to minimize reflection thereof by the substrate; a grating layer disposed over the absorber layer, having a binary surface-relief pattern formed therein, wherein the binary surface-relief pattern includes ridges having rectangular or trapezoidal cross-sections, separated by grooves; and a conforming reflective layer disposed over the binary surface-relief pattern, forming a grating profile.

The present invention also relates to a method of fabricating one or more reflective diffraction gratings, the method comprising: providing a substrate; depositing a UV-absorbing layer over the substrate for absorbing light at a UV recording wavelength to minimize reflection thereof by the substrate; depositing a grating layer over the UV-absorbing layer; applying a photoresist layer over the grating layer; patterning the photoresist layer by holography at the UV recording wavelength; etching the grating layer through the patterned photoresist layer to form a binary surface-relief pattern therein, wherein the binary surface-relief pattern includes ridges having rectangular or trapezoidal cross-sections, separated by grooves; removing the patterned photoresist layer; and depositing a conforming reflective layer over the binary surface-relief pattern to form a grating profile.

The present invention also relates to a wafer-level method of fabricating a plurality of reflective diffraction gratings, which further comprises: testing the grating profile by a wafer-level characterization process to provide a test result; and reworking the conforming reflective layer if the test result is a fail; or singulating the substrate to form a plurality of reflective diffraction gratings if the test result is a pass.

BRIEF DESCRIPTION OF THE DRAWINGS

The present invention will be described in greater detail with reference to the accompanying drawings, which represent exemplary embodiments thereof, wherein:

FIG. 4A is a table of profile parameters for an exemplary reflective diffraction grating for use in air, having a line frequency of 1150 lines/mm;

FIG. 4B is a table of profile parameters for an exemplary reflective diffraction grating for use in a grism, having a line frequency of 1624 lines/mm;

FIG. 4C is a table of profile parameters for an exemplary reflective diffraction grating for use in a grism, having a line frequency of 1670 lines/mm;

DETAILED DESCRIPTION OF THE INVENTION

Figure 1A:
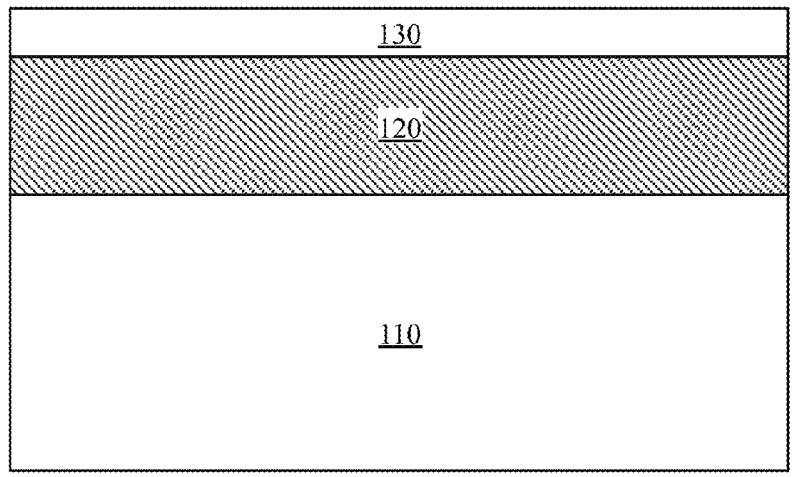
FIGS. 1A to 1E are schematic illustrations of steps in a method of fabricating a reflective diffraction grating according to the present invention.
Figure 1B:
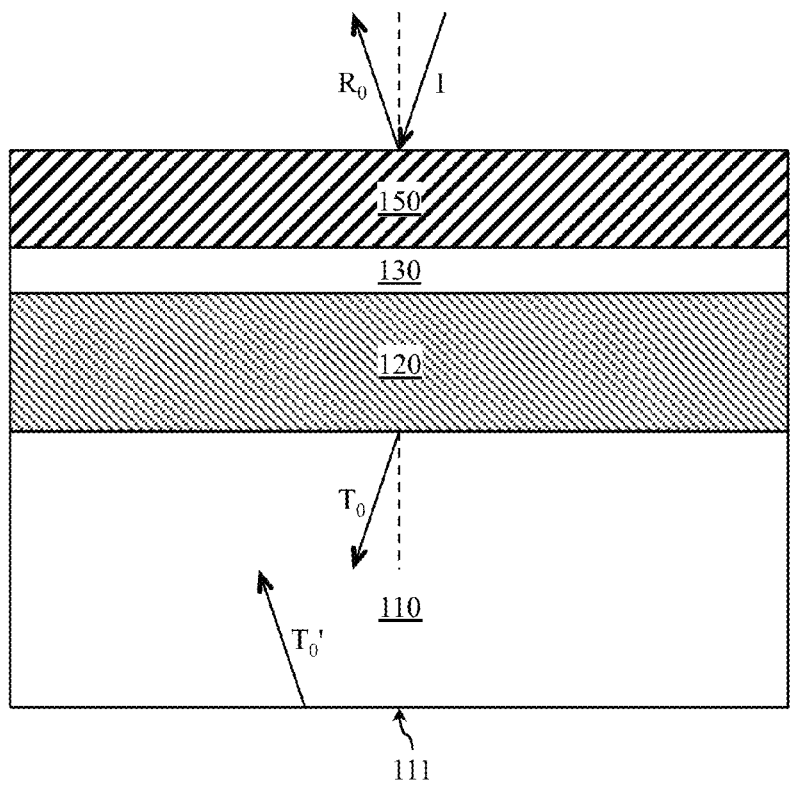
Figure 1C:
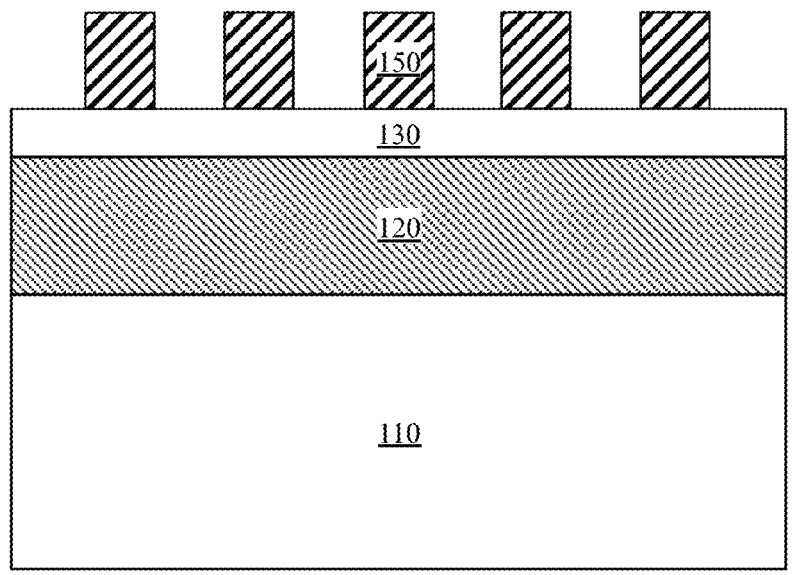
Figure 1D:
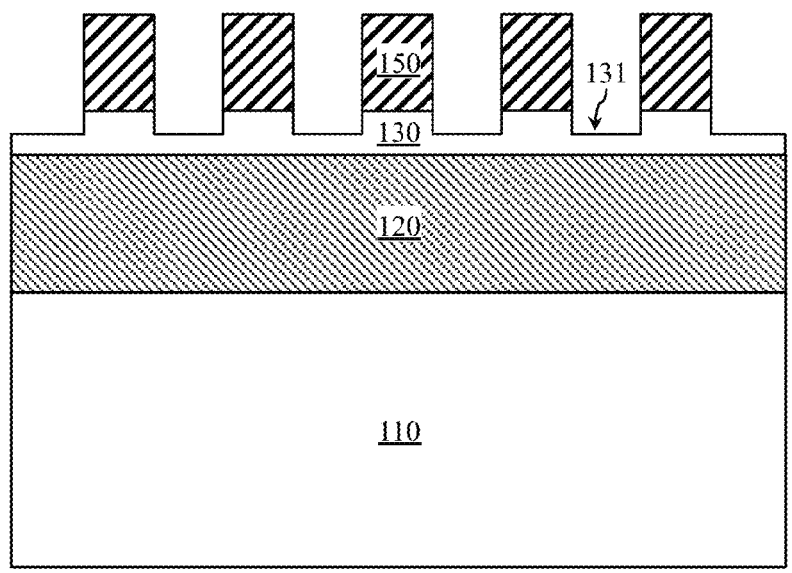
Figure 1E:
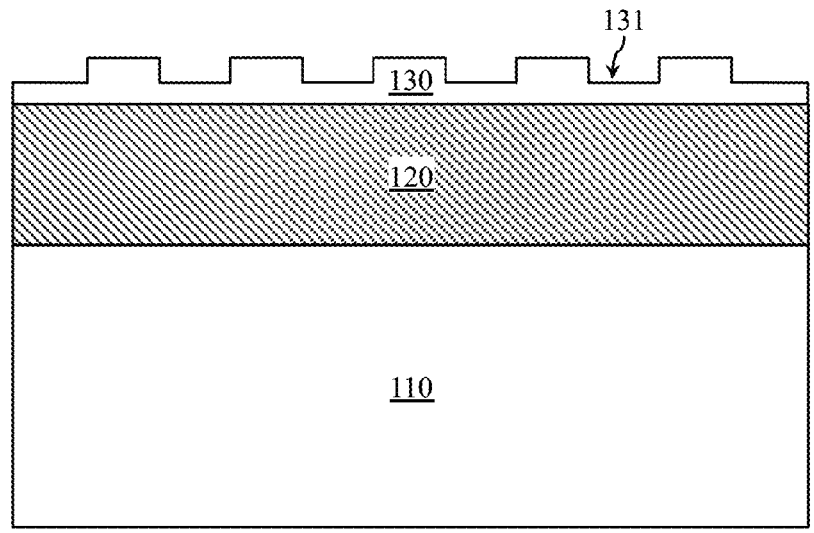
Figure 1F:
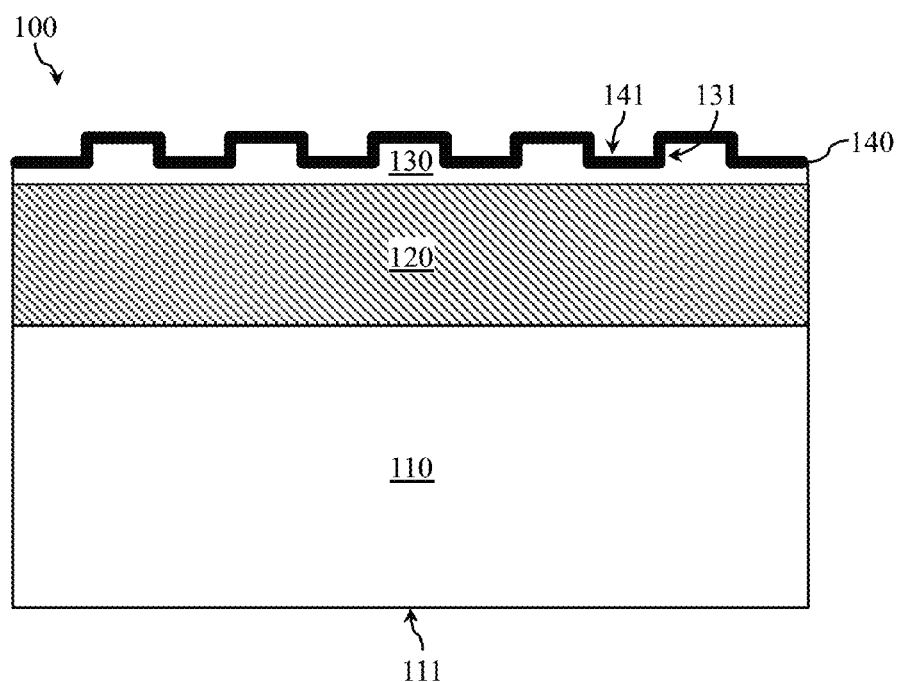
FIG. 1F is a schematic illustration of a cross-section of a reflective diffraction grating according to the present invention.

With reference to FIG. 1F, the present invention provides a reflective diffraction grating 100, which is fabricated by holographic lithography, i.e., interference lithography, at an ultraviolet (UV) recording wavelength, as explained in further detail hereinbelow. The UV recording wavelength is in the UV spectral region, typically, in a wavelength range of about 10 nm to about 450 nm, e.g., 193 nm, 248 nm, 365 nm, or 436 nm.

The reflective diffraction grating 100 is designed for use, i.e., for reflection and diffraction of light, over an operating wavelength range, which depends on the application. Often, the operating wavelength range is in the infrared (IR) spectral region. For example, for telecommunication applications, the operating wavelength range may be a telecommunication wavelength band, e.g., the conventional band (C band) of about 1520 nm to about 1570 nm, or the long-wavelength band (L band) of about 1555 nm to about 1625 nm. The reflective diffraction grating may be designed for use with transverse-magnetic (TM)-polarized, i.e., p-polarized, light, transverse-electric (TE)-polarized, i.e., s-polarized, light, or both, i.e., for low polarization-dependent loss. The reflective diffraction grating 100 may be used as a stand-alone component or may be incorporated in another component, e.g., a grism. Often, the reflective diffraction grating 100 is used as part of a wavelength-selective device, e.g., a wavelength-selective switch (WSS).

The reflective diffraction grating 100 includes a substrate 110, a UV-absorbing layer 120 disposed over the substrate 110, a grating layer 130 disposed over the UV-absorbing layer 120, and a conforming reflective layer 140 disposed over the grating layer 130.

Together, the UV-absorbing layer 120 and the grating layer 130 constitute a thin-film stack. Because the thin-film stack is separate from the substrate 110, the design of the reflective diffraction grating 100 is largely independent of the substrate material. The substrate 110 is, typically, formed of a dielectric substrate material, e.g., fused silica ($SiO_2$) or another common glass. Often, a bottom surface 111 of the substrate 110 is polished.

The UV-absorbing layer 120 is a continuous unpatterned, i.e., unetched, layer, which is, typically, disposed directly on the substrate 110. Advantageously, the UV-absorbing layer 120 serves to absorb light at the UV recording wavelength to minimize reflection of such light by the substrate 110, in particular, by a bottom surface 111 thereof, during holographic patterning, as explained in further detail hereinbelow.

The UV-absorbing layer 120 is, typically, formed of a UV-absorbing dielectric material, e.g., tantala ($Ta_2O_5$), niobia ($Nb_2O_5$), or titania ($TiO_2$), that absorbs UV light, in particular, light at the UV recording wavelength. Preferably, the UV-absorbing dielectric material has an extinction coefficient of greater than about 0.025 at the UV recording wavelength. For example, the UV-absorbing dielectric material may be tantala having an extinction coefficient of about 0.028 at 365 nm, referred to as normal tantala. Normal tantala has a substantially stoichiometric composition, i.e., $Ta_2O_5$, and, typically, appears substantially transparent as a thin film. More preferably, the UV-absorbing dielectric material has an extinction coefficient greater than about 0.035 at the UV recording wavelength. For example, the UV-absorbing dielectric material may be tantala having an extinction coefficient of about 0.04 at 365 nm, referred to as brown tantala. Brown tantala has a composition substoichiometric in oxygen, i.e., $Ta_2O_{5-x}$, and, typically, appears dark brown as a thin film.

The UV-absorbing layer 120 has a thickness large enough to allow significant absorption of light at the UV recording wavelength and, accordingly, a significant reduction in the transmission of such light. Typically, the UV-absorbing layer 120 has a thickness of greater than about 1.2 μm and less than about 2 μm. Preferably, the UV-absorbing layer 120 has a thickness of greater than about 1.5 μm.

The grating layer 130 is a patterned layer, which is, typically, disposed directly on the UV-absorbing layer 120. The grating layer 130 has a surface-relief pattern 131 formed therein by etching. Typically, only an upper portion of the grating layer 130 is etched, and the grating layer 130 is continuous. The surface-relief pattern 131 includes ridges separated by etched grooves. The surface-relief pattern 131 is binary, meaning that the ridges are rectangular or trapezoidal in cross-section. Typically, the tops of the ridges are substantially parallel to the top surface of the substrate 110, and the sidewalls of the ridges are substantially perpendicular to the top surface of the substrate 110.

The grating layer 130 is, typically, formed of a dielectric grating material, e.g., silica. Advantageously, as dielectric thin films, the grating layer 130 and the UV-absorbing layer 120 are, generally, physically stable at temperatures up to a few hundred degrees Celsius. Typically, the grating layer 130 has a thickness of greater than about 0.2 μm and less than about 1.5 μm.

Figure 1G:
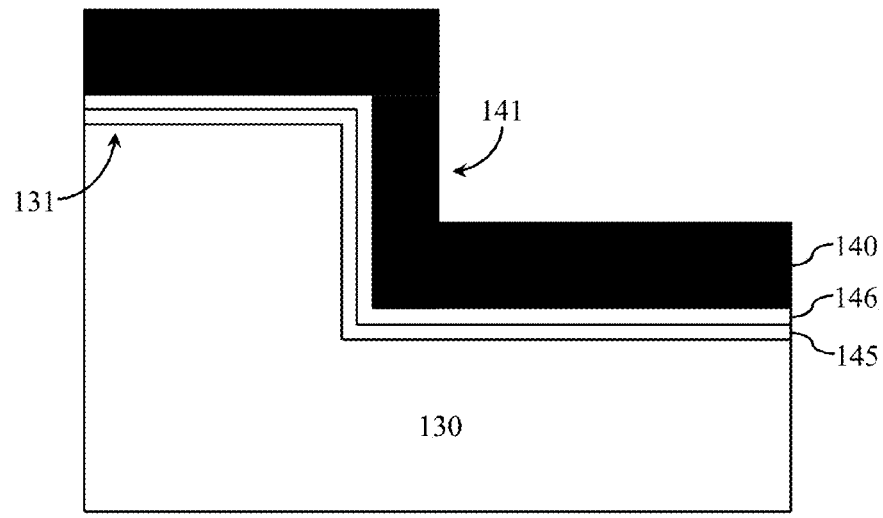
FIG. 1G is a schematic illustration of a cross-section of a portion of the reflective diffraction grating of FIG. 1F, showing the grating profile.

The conforming reflective layer 140 is disposed over the surface-relief pattern 131 of the grating layer 130, i.e., over the tops and sidewalls of the ridges, and over the bottoms of the grooves, so that it substantially conforms to the surface-relief pattern 131, forming a diffraction profile 141. With reference also to FIG. 1G, although the conforming reflective layer 140 may be disposed directly on the surface-relief pattern 131, it is preferable that a thin adhesion layer 145 be inserted between the grating layer 130 and the conforming reflective layer 140 to promote adhesion between these layers. Optionally, an additional thin barrier layer 146 may be inserted between the conforming reflective layer 140 and the adhesion layer 145 to suppress diffusion between these layers, especially at higher temperatures, e.g., greater than about 250° C. Depending on the embodiment, the conforming reflective layer 140 may be conformingly disposed on the adhesion layer 145 or the barrier layer 146.

The conforming reflective layer 140 is, typically, formed of a reflective metal, e.g., gold. The adhesion layer 145 may be formed of titanium, and the barrier layer 146 may be formed of titanium nitride (TiN). Typically, the conforming reflective layer 140 has a thickness of greater than 40 nm on the sidewalls of the ridges, preferably, greater than 60 nm. In general, the sidewall thickness is large enough to prevent leakage of light through the sidewalls into the underlying grating layer 130, in order to suppress interference between leaked light and diffracted light. Typically, the adhesion layer 145 and the barrier layer 146 each have a thickness of a few nanometers.

Figure 2:
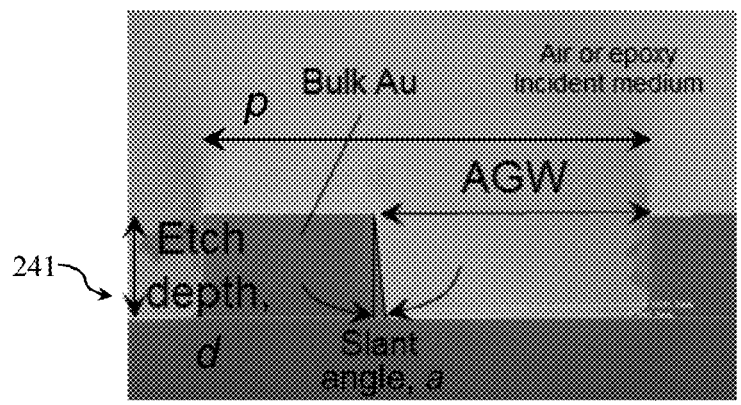
FIG. 2 is a scanning electron micrograph of a cross-section of a model grating profile formed of bulk gold.

The conforming reflective layer 140, which substantially conforms to the surface-relief pattern 131, forms the grating profile 141 of the reflective diffraction grating 100. With reference to FIG. 2, a scanning electron micrograph of a cross-section of a model grating profile 241 formed of bulk gold shows parameters defining the grating profile 241, referred to as profile parameters. The profile parameters include etch depth d, slant angle a, air-groove width (AGW), and pitch p, which corresponds to a sum of the ridge top width and the AGW.

With reference again to FIG. 1F, these profile parameters are selected on the basis of the application for which the reflective diffraction grating 100 is used and the desired diffraction efficiency. Typically, the etch depth is between about 0.1 μm and about 1 μm, the slant angle is between about −10° and +10°, the AGW is between about 0.2 µm and about 0.7 µm, and the pitch is between about 0.5 µm and about 1.0 µm.

With reference to FIG. 1, the present invention also provides a method of fabricating the reflective diffraction grating 100 by holographic lithography. With particular reference to FIG. 1A, the substrate 110 is provided, and the thin-film stack is deposited over the substrate 110, typically, by sputtering. Specifically, the UV-absorbing layer 120 is deposited over the substrate 110, and the grating layer 130 is deposited over the UV-absorbing layer 120.

With particular reference to FIG. 1B, a photoresist layer 150, e.g., having a thickness between about 0.4 µm and about 0.6 µm, is applied over the grating layer 130 of the thin-film stack, typically, by spin coating or spray coating. The photoresist layer 150 is then patterned by holography at the UV recording wavelength to form a patterned photoresist layer 150, illustrated in FIG. 1C.

The photoresist layer 150 is exposed to an interference pattern, which is recorded in the photoresist layer 150. In general, when a recording beam I of light at the UV recording wavelength, e.g., 365 nm, is incident on the photoresist layer 150, e.g., at an angle of incidence of about 10° to about 20°, it is partially reflected as reflected beam $R_0$. If the intensity of the reflected beam $R_0$ is too high, interference between the incident recording beam I and the reflected beam $R_0$ can lead to undesired interference patterns, i.e., standing-wave patterns, causing corrugations in the pattern recorded in the photoresist layer 150. Such corrugations are detrimental to the resulting surface-relief pattern 131.

Most of the non-reflected light is transmitted through the photoresist layer 150 and the thin-film stack, i.e., the grating layer 130 and the UV-absorbing layer 120, resulting in a transmitted beam $T_0$. When the transmitted beam $T_0$ is incident on the bottom surface 111, i.e., the backside, of the substrate 110, it is partially reflected as a backside-reflected beam $T_0'$. Such backside reflections are particularly important when the bottom surface 111 of the substrate 110 is polished, as is often required for reflective diffraction gratings used in WSSs.

The inventors of the present invention experimentally determined that, if the intensity of the backside-reflected beam $T_0'$ is too high, interference between the incident recording beam I and the backside-reflected beam $T_0'$ can lead to undesired interference patterns causing corrugations in the pattern recorded in the photoresist layer 150. Therefore, the UV-absorbing layer 120 was included in the design of the reflective diffraction grating 100 to absorb light at the UV recording wavelength. Thereby, the intensity of the transmitted beam $T_0$ is decreased, and the intensity of the backside-reflected beam $T_0'$ is correspondingly decreased. In other words, transmission by the thin-film stack is reduced to minimize backside reflections. Accordingly, undesired interference patterns resulting from backside reflections are suppressed.

With particular reference to FIG. 1C, the recorded pattern is developed by using a suitable developer or solvent, leaving a patterned photoresist layer 150, which serves as an etch mask. With particular reference to FIG. 1D, the grating layer 130 is etched, typically, by reactive-ion etching (RIE), through the patterned photoresist layer 150 to form the surface-relief pattern 131. Typically, only an upper portion of the grating layer 130 is etched, without etching the UV-absorbing layer 120. Preferably, the surface-relief pattern 131 is formed to have a base AGW that is larger than a final AGW desired for the grating profile 141, allowing a relatively thick conforming reflective layer 140 to be deposited. Typically, the base AGW is about 1.5 times larger than the final AGW. For example, the base AGW may be about 80% of the pitch, and the final AGW may be about 50% of the pitch. With particular reference to FIG. 1E, the patterned photoresist layer 150 is removed by using a suitable stripper or solvent to uncover the surface-relief pattern 131.

With particular reference to FIGS. 1F and 1G, an adhesion layer 145 is, preferably, deposited over the surface-relief pattern 131, and the conforming reflective layer 140 is deposited over the adhesion layer 145 to form the grating profile 141. Optionally, a barrier layer 146 may be deposited over the adhesion layer 145, and the conforming reflective layer 140 deposited over the barrier layer 146. Typically, the adhesion layer 145, the optional barrier layer 146, and the conforming reflective layer 140 are deposited by sputtering. The conforming reflective layer 140 is deposited to a thickness providing the final AGW desired for the grating profile 141.

Figure 3:
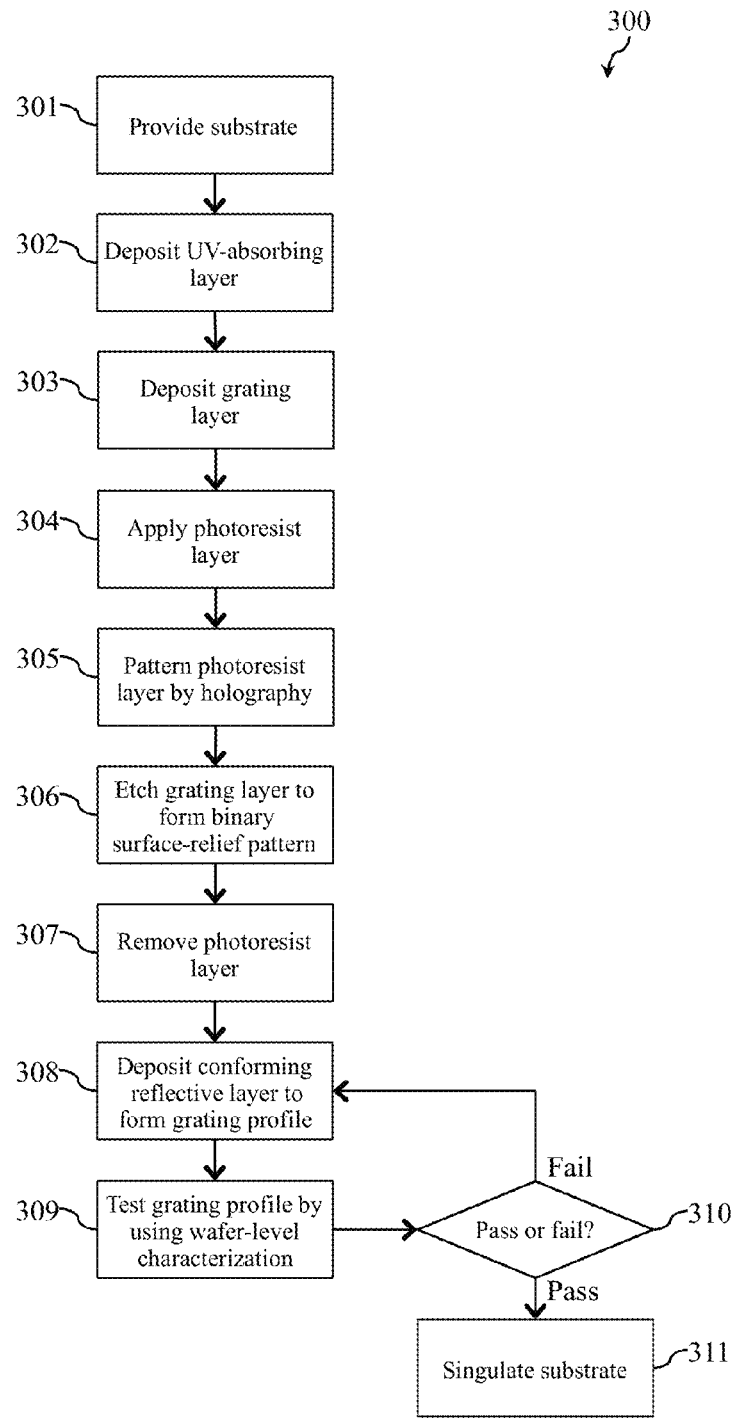
FIG. 3 is a flowchart of a wafer-level method of fabricating a plurality of reflective diffraction gratings according to the present invention.

With reference to FIG. 3, the fabrication method can be implemented as a wafer-level method 300 of fabricating a plurality of reflective diffraction gratings. In step 301, a substrate, i.e., a wafer, is provided. In step 302, a UV-absorbing layer, for absorbing light at a UV recording wavelength to minimize reflection thereof by the substrate, is deposited over the substrate. In step 303, a grating layer is deposited over the UV-absorbing layer. In step 304, a photoresist layer is applied over the grating layer. In step 305, the photoresist layer is patterned by holography at the UV recording wavelength. In step 306, the grating layer is etched through the patterned photoresist layer to form a binary surface-relief pattern therein, which includes rectangular or trapezoidal ridges separated by grooves. In step 307, the photoresist layer is removed. In step 308, a conforming reflective layer, typically, together with an adhesion layer, is deposited over the binary surface-relief pattern to form a grating profile. Preferably, the surface-relief pattern is characterized, e.g., by physically measuring its AGW using atomic force microscopy (AFM), prior to depositing the conforming reflective layer in step 308, in order to select the deposition thickness. Further details relating to steps 301 to 308 are provided in the description of the fabrication method hereinabove.

In the wafer-level fabrication method, an optimal thickness for the conforming reflective layer is determined by iterative deposition and testing cycles. After the conforming reflective layer is deposited in step 308, the grating profile is tested in step 309 by using a wafer-level characterization technique, which may be a physical technique, e.g., AFM, or an optical technique, to provide a pass/fail test result 310 as feedback. If the test result 310 is a fail, the conforming reflective layer is reworked, and the method returns to step 308. The conforming reflective layer may be reworked by increasing the layer thickness or by removing and re-depositing the layer. Layer removal is carried out by a suitable metal-etch process that ensures that the underlying grating layer is not etched or altered in any way. Care must be taken to avoid physically changing the surface-relief profile. Steps 308 and 309 are repeated as necessary until an optimal thickness is obtained and the grating profile passes the test.

In an exemplary embodiment, two different tests are performed in step 309, allowing coarse and fine adjustment of the thickness of the conforming reflective layer, respectively. During coarse thickness adjustment, testing the grating profile in step 309 includes physically measuring an AGW of the grating profile, e.g., by AFM, and comparing the measured AGW to an AGW tolerance. The test result 310 is a pass if the measured AGW is within the AGW tolerance and a fail if the measured AGW is outside of the AGW tolerance. If the measured AGW is smaller than a low value of the AGW tolerance, deposition of the conforming reflective layer may be continued to increase its thickness in step 308. For example, the layer thickness may be increased in steps of about 400 Å. Coarse thickness adjustment is continued until the test result 310 is a pass at this stage, i.e., the measured AGW is within the AGW tolerance, and a roughly correct design space is reached.

Fine thickness adjustment is then used to fine-tune the thickness of the conforming reflective layer. During fine thickness adjustment, testing the grating profile in step 309 includes optically measuring a diffraction efficiency (DE) of the grating profile, and comparing the measured DE to a minimum DE, e.g., about 90%. Preferably, the DE of the grating profile is measured at several locations on the wafer to determine a diffraction efficiency uniformity (DEU), which is compared to a maximum DEU, e.g., about 5%. A diffraction grating test system (DGTS) is, preferably, used to measure the DE and the DEU. The DGTS is a stepper-based system which moves the wafer to illuminate, with light of a desired polarization and wavelength, various grating chip positions and which then, with properly positioned optics/mirrors, deflects the first reflected diffraction order to a detector which measures the diffraction efficiency.

The test result 310 is a pass if the measured DE is greater than the minimum DE and, preferably, if the measured DEU is also less than the maximum DEU. The test result 310 is a fail if the measured DE is less than the maximum DE and/or if the measured DEU is greater than the maximum DEU. If the measured DE less than the maximum DE, deposition of the conforming reflective layer may be continued to increase its thickness in step 308. For example, the layer thickness may be increased in steps of about 100 Å. Fine thickness adjustment is continued until the test result 310 is a pass at this stage, i.e., the measured DE is greater than the minimum DE and, preferably, the measured DEU is less than the maximum DEU. If a pass is not reached after this stage, the wafer is reworked by removing the conforming reflective layer.

If the test result 310 is a pass, the substrate is singulated to provide a plurality of reflective diffraction gratings in step 311. Typically, the reflective diffraction gratings are then visually inspected. Advantageously, such an iterative wafer-level fabrication method 300, typically, improves device manufacturing yield and reduces defects, e.g., resulting from handling, relative to a chip-level process. In general, these advantages reduce manufacturing costs.

Some exemplary reflective diffraction gratings for use in wavelength-selective switches (WSSs) are described hereafter to further illustrate the present invention. The exemplary reflective diffraction gratings are designed to provide a high diffraction efficiency in the first diffraction order in a near-Littrow geometry for TM-polarized light, e.g., with a polarization extinction ratio of about 10 dB. Typically, the exemplary reflective diffraction gratings provide a diffraction efficiency of greater than about 90% across the telecommunication wavelength C band.

In a design method, the reflective metal for the conforming reflective layer is first selected, and the profile parameters for the grating profile are determined. To ensure high diffraction efficiency, gold was selected as the reflective metal for the exemplary reflective diffraction gratings. Profile parameters, i.e., the etch depth d, the slant angle a, and the air-groove width (AGW), were calculated for a model grating profile of a particular pitch p formed of bulk gold, as shown in FIG. 2, used at a particular angle of incidence (AOI).

FIG. 4A tabulates the profile parameters, the AOI, and their tolerances for a first exemplary reflective diffraction grating for use in air as the incidence medium, having a line frequency of 1150 lines/mm, i.e., a pitch of 0.870 µm. FIG. 4B tabulates the profile parameters, the AOI, and their tolerances for a second exemplary reflective diffraction grating for use in a grism with epoxy as the incidence medium, having a line frequency of 1624 lines/mm, i.e., a pitch of 0.616 µm. FIG. 4A tabulates the profile parameters, the AOI, and their tolerances for a third exemplary reflective diffraction grating for use in a grism with epoxy as the incidence medium, having a line frequency of 1670 lines/mm, i.e., a pitch of 0.599 µm.

Materials and thicknesses are then selected for the thin-film stack, i.e., the grating layer and the UV-absorbing layer. A thickness is also selected for the photoresist layer. For the exemplary reflective diffraction gratings, silica was selected as the grating dielectric material, and a thickness of 0.27 µm was selected for the grating layer. A thickness of 0.53 µm was selected for the photoresist layer.

The UV-absorbing dielectric material and the thickness of the UV-absorbing layer are selected to suppress undesired interference patterns during holographic patterning at the UV recording wavelength. For the exemplary reflective diffraction gratings, the UV recording wavelength was 365 nm, and tantala was selected as the UV-absorbing dielectric material. Both normal tantala, having a refractive index of about 2.4 and an extinction coefficient of about 0.028 at 365 nm, and brown tantala, having a refractive index of about 2.4 and an extinction coefficient of about 0.040 at 365 nm, were investigated as UV-absorbing dielectric materials.

Figure 5:
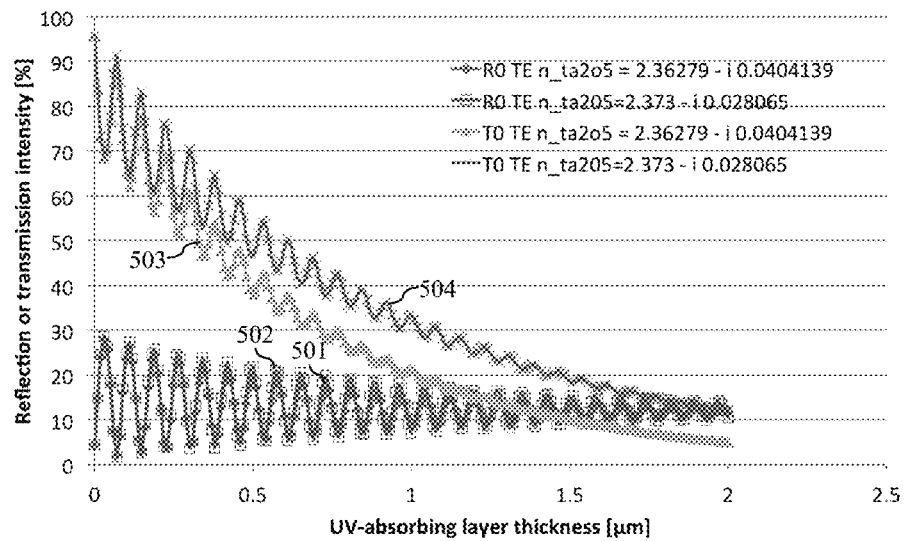
FIG. 5 is a plot of reflection intensity and transmission intensity against ultraviolet (UV)-absorbing layer thickness for brown tantala and normal tantala as the UV-absorbing dielectric material.

The effects of increasing the thickness of the UV-absorbing layer on the intensities of the reflected beam $R_0$ and the transmitted beam $T_0$ were investigated for brown tantala and normal tantala as the UV-absorbing dielectric material. In FIG. 5, the reflection intensity for brown tantala 501, the reflection intensity for normal tantala 502, the transmission intensity for brown tantala 503, and the transmission intensity for normal tantala 504 are plotted against the thickness of the UV-absorbing layer, which varied between 0 and 2.0 µm. The recording beam I of light at 365 nm was TE-polarized and was incident on the photoresist layer at an angle of incidence of about 17.2°.

Increasing the thickness of the UV-absorbing layer significantly reduces backside reflections. The transmission intensity for normal tantala 504 decreases from about 80% to about 25% by increasing the thickness of the UV-absorbing layer from 0 to 1.2 µm. The transmission intensity for normal tantala 504 can be decreased further to about 20% at a thickness of 1.5 µm, and to about 12% at a thickness of 2.0 µm.

The suppression of backside reflections is even greater when brown tantala is used as the UV-absorbing dielectric material. The transmission intensity for brown tantala 503 decreases from about 80% to about 15% when the thickness of the UV-absorbing layer increases from 0 to 1.2 µm. The transmission intensity for brown tantala 503 further decreases to about 10% at a thickness of 1.5 µm, and to about 5% at a thickness of 2.0 µm.

With respect to the reflection intensities for brown tantala 501 and normal tantala 502, increasing the thickness of the UV-absorbing layer from 0 to 1.2 µm has the effect of reducing the magnitude of the intensity fluctuations, i.e., ripple, from about ±14% to about ±5%. The magnitude of the intensity fluctuations is slightly smaller for brown tantala than for normal tantala. Advantageously, reducing the magnitude of the intensity fluctuations reduces the sensitivity of the fabrication method to variations in the thickness of the UV-absorbing layer.

In this manner, it was found that a UV-absorbing layer formed of brown tantala at a thickness of about 1.5 μm provided suitable suppression of undesired interference patterns and, hence, allowed the fabrication method to meet the intended design targets.

Once designed, the exemplary reflective diffraction gratings were fabricated according to the method described hereinabove. A fused silica substrate having a thickness of about 3 mm was provided. A UV-absorbing layer formed of brown tantala was deposited to a thickness of about 1.5 μm on the substrate, and a grating layer formed of silica was deposited to a thickness of about 0.27 μm on the UV-absorbing layer.

A photoresist layer was applied on the grating layer to a thickness of about 0.53 μm. A pattern was recorded in the photoresist layer by holography at a UV recording wavelength of 365 nm and developed to form a photoresist etch mask. The grating layer was then etched through the photoresist etch mask to form a binary surface-relief pattern having the etch depth d and the slant angle a tabulated in FIG. 4, but a larger base AGW corresponding to about 80% of the pitch.

An adhesion layer formed of titanium was deposited on the patterned grating layer to a thickness of a few nanometers, and a conforming reflective layer formed of gold was deposited on the adhesion layer to a thickness of about 100 nm. This relatively large deposition thickness ensured that the grating profile as a whole had good reflectivity, and that the ridge sidewalls, in particular, had a thickness of greater than about 40 nm. By coating the surface-relief pattern with the conforming reflective layer, the AGW of the grating profile was increased to a value close to the final AGW tabulated in FIG. 4, corresponding to about 50% of the pitch.

Figure 6:
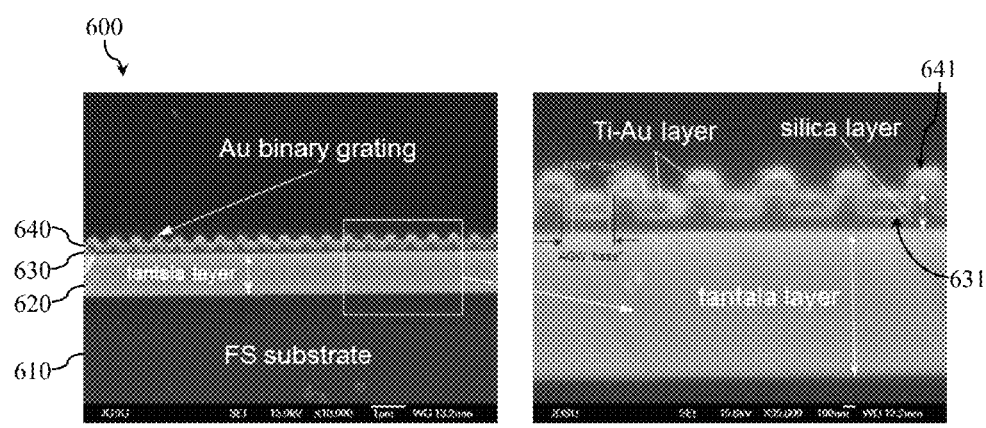
FIG. 6 is a scanning electron micrograph of a cross-section of an exemplary reflective diffraction grating.

With reference to FIG. 6, a scanning electron micrograph of a cross-section of an exemplary reflective diffraction grating 600 fabricated according to this fabrication method shows the fused silica substrate 610, the UV-absorbing layer 620 formed of brown tantala, the grating layer 630 formed of silica, and the conforming reflective layer 640 formed of gold over the adhesion layer formed of titanium. In particular, the enlargement in FIG. 6 shows how the AGW of the grating profile 641 was tuned by forming the surface-relief pattern 631 to have a larger base AGW and by depositing the conforming reflective layer 640 to a thickness providing the grating profile 641 with the final AGW. The base AGW is approximately 1.5 times larger than the final AGW.

Of course, numerous other embodiments may be envisaged without departing from the spirit and scope of the invention.

We claim:

1. A reflective diffraction grating comprising:
   a substrate;
   an ultraviolet (UV)-absorbing layer disposed over the substrate, and separate from the substrate, for absorbing light at a UV recording wavelength during holographic patterning,
   the UV-absorbing layer being:
   formed of a UV-absorbing dielectric material having an extinction coefficient of greater than about 0.025 at the UV recording wavelength, and having a thickness greater than 1.2 μm and less than 2 μm;
   a grating layer, disposed over the UV-absorbing layer, having a binary surface-relief pattern formed therein, wherein the binary surface-relief pattern includes ridges having rectangular or trapezoidal cross-sections separated by grooves; and
   a conforming reflective layer, disposed over the binary surface-relief pattern, forming a grating profile,
   the grating profile being associated with profile parameters, and
   the UV-absorbing dielectric material and the thickness of the UV-absorbing layer being selected such that particular patterns are suppressed during the holographic patterning.

2. The reflective diffraction grating of claim 1, wherein the UV-absorbing layer has a thickness of greater than about 1.5 μm.

3. The reflective diffraction grating of claim 1, wherein the UV-absorbing layer is continuous and unpatterned.

4. The reflective diffraction grating of claim 1, wherein the UV-absorbing layer is formed of brown tantala.

5. The reflective diffraction grating of claim 1, wherein the extinction coefficient is greater than about 0.035 at the UV recording wavelength.

6. The reflective diffraction grating of claim 1, wherein the reflective diffraction grating is fabricated by holographic lithography at the UV recording wavelength, and wherein the UV recording wavelength is in a wavelength range of about 10 nm to about 450 nm.

7. The reflective diffraction grating of claim 1, wherein the binary surface-relief pattern has a base air-groove width (AGW) about 1.5 times larger than a final AGW of the grating profile.

8. The reflective diffraction grating of claim 1, wherein the UV-absorbing layer is formed of tantala, wherein the grating layer is formed of silica, and wherein the conforming reflective layer is formed of gold.

9. The reflective diffraction grating of claim 8, further comprising:
   an adhesion layer disposed between the binary surface-relief pattern and the conforming reflective layer, wherein the adhesion layer is formed of titanium.

10. The reflective diffraction grating of claim 9, further comprising:
    a barrier layer disposed between the adhesion layer and the conforming reflective layer, wherein the barrier layer is formed of titanium nitride.

11. A method of fabricating one or more reflective diffraction gratings, the method comprising:
    providing a substrate;
    depositing an ultraviolet (UV)-absorbing layer over the substrate, and separate from the substrate, for absorbing light at a UV recording wavelength to minimize reflection thereof by the substrate, the UV-absorbing layer being:
    formed of a UV-absorbing dielectric material having an extinction coefficient of greater than about 0.025 at the UV recording wavelength, and having a thickness greater than 1.2 μm and less than 2 μm;
    depositing a grating layer over the UV-absorbing layer;
    applying a photoresist layer over the grating layer;
    patterning the photoresist layer by holography at the UV recording wavelength;
    etching the grating layer through the patterned photoresist layer to form a binary surface-relief pattern therein, wherein the binary surface-relief pattern includes ridges having rectangular or trapezoidal cross-sections separated by grooves;
    removing the patterned photoresist layer; and
    depositing a conforming reflective layer over the binary surface-relief pattern to form a grating profile, the UV-absorbing dielectric material and the thickness of the UV-absorbing layer being selected such that particular patterns are suppressed during holographic patterning.

12. The method of claim 11, wherein the UV-absorbing layer is deposited to a thickness of greater than about 1.5 μm.

13. The method of claim 11, wherein the grating layer is etched by etching an upper portion of the grating layer without etching the UV-absorbing layer.

14. The method of claim 11, wherein the binary surface-relief pattern is formed to have a base air-groove width (AGW), wherein the conforming reflective layer is deposited to a thickness providing the grating profile with a final AGW, and wherein the base AGW is about 1.5 times larger than the final AGW.

15. The method of claim 11, further comprising:
depositing an adhesion layer over the binary surface-relief pattern, wherein the conforming reflective layer is deposited over the adhesion layer.

16. The method of claim 15, further comprising:
depositing a barrier layer over the adhesion layer, wherein the conforming reflective layer is deposited over the barrier layer.

17. The method of claim 11, further comprising:
testing the grating profile by using a wafer-level characterization technique to provide a test result; and
selectively:
reworking the conforming reflective layer if the test result is a fail; or
singulating the substrate to form a plurality of reflective diffraction gratings if the test result is a pass.

18. The method of claim 17, wherein the substrate is reworked by removing and re-depositing the conforming reflecting layer.

19. The method of claim 17, wherein the substrate is reworked by continuing deposition of the conforming reflecting layer.

20. The method of claim 17, wherein testing the grating profile includes measuring at least one of an AGW of the grating profile, a diffraction efficiency of the grating profile, or a diffraction efficiency uniformity of the grating profile.

* * * * *